United States Patent
Altman et al.

(10) Patent No.: US 11,558,957 B2
(45) Date of Patent: Jan. 17, 2023

(54) SHAPE MEMORY THERMAL CAPACITOR AND METHODS FOR SAME

(71) Applicants: Raytheon Company, Waltham, MA (US); THE UNITED STATES OF AMERICA AS REPRESENTED BY THE SECRETARY OF THE ARMY, Adelphi, MD (US)

(72) Inventors: David H. Altman, Framingham, MA (US); Christopher H. Peters, Stoneham, MA (US); Gregory P. Schaefer, McKinney, TX (US); Philip M. Henault, Medway, MA (US); Darin J. Sharar, Silver Springs, MD (US)

(73) Assignees: Raytheon Company, Waltham, MA (US); THE UNITED STATES OF AMERICA AS REPRESENTED BY THE SECRETARY OF THE ARMY, Adelphi, MD (US)

( * ) Notice: Subject to any disclaimer, the term of this patent is extended or adjusted under 35 U.S.C. 154(b) by 219 days.

(21) Appl. No.: 16/900,390

(22) Filed: Jun. 12, 2020

(65) Prior Publication Data

US 2021/0392737 A1    Dec. 16, 2021

(51) Int. Cl.
*H05K 1/02*        (2006.01)
*H05K 3/00*        (2006.01)

(52) U.S. Cl.
CPC .............. *H05K 1/0204* (2013.01); *H05K 3/00* (2013.01); *H05K 2201/10416* (2013.01)

(58) Field of Classification Search
CPC .................. H05K 1/0204; H05K 3/00; H05K 2201/10416
See application file for complete search history.

(56) References Cited

U.S. PATENT DOCUMENTS

| | | | | |
|---|---|---|---|---|
| 4,737,395 A | * | 4/1988 | Mabuchi | H05K 1/021 428/209 |
| 5,051,097 A | * | 9/1991 | Miles | H01R 12/00 439/75 |

(Continued)

FOREIGN PATENT DOCUMENTS

| | | |
|---|---|---|
| DE | 102018125008 A1 | 4/2020 |
| EP | 1528847 A1 | 5/2005 |

(Continued)

OTHER PUBLICATIONS

"International Application Serial No. PCT/US2021/037064, International Search Report dated Sep. 17, 2021", 6 pgs.

(Continued)

*Primary Examiner* — Michael A Matey
(74) *Attorney, Agent, or Firm* — Schwegman Lundberg & Woessner, P.A.

(57) ABSTRACT

An electronic assembly including a thermal capacitor. An electronic substrate of the electronic assembly includes one or more insulating layers and one or more conductor layers provided along the one or more insulating layers. The one or more conductor layers including a conductive material. A shape memory thermal capacitor is received in the electronic substrate. The shape memory thermal capacitor includes a shape memory core including a shape memory material.

23 Claims, 5 Drawing Sheets

(56) References Cited

U.S. PATENT DOCUMENTS

| | | | | |
|---|---|---|---|---|
| 5,173,844 | A * | 12/1992 | Adachi | H01L 24/83 |
| | | | | 361/764 |
| 5,459,639 | A * | 10/1995 | Izumi | H01L 23/427 |
| | | | | 257/713 |
| 5,913,736 | A * | 6/1999 | Maehara | A63B 37/0047 |
| | | | | 473/360 |
| 7,025,607 | B1 * | 4/2006 | Das | H01G 4/206 |
| | | | | 439/85 |
| 7,301,105 | B2 * | 11/2007 | Vasoya | H05K 3/4694 |
| | | | | 361/748 |
| 7,741,566 | B2 | 6/2010 | Johnson | |
| 7,791,896 | B1 * | 9/2010 | Fan | H05K 1/185 |
| | | | | 361/765 |
| 9,185,791 | B2 * | 11/2015 | Wang | H01L 33/642 |
| 9,693,445 | B2 * | 6/2017 | Ku | H05K 1/115 |
| 10,433,414 | B2 * | 10/2019 | Wu | H05K 1/0204 |
| 11,337,303 | B2 * | 5/2022 | Tain | H05K 1/0207 |
| 2003/0143958 | A1 * | 7/2003 | Elias | H01L 23/3733 |
| | | | | 455/73 |
| 2006/0017152 | A1 * | 1/2006 | White | H01L 23/055 |
| | | | | 257/E23.173 |
| 2007/0090517 | A1 * | 4/2007 | Moon | H01L 25/0657 |
| | | | | 257/E21.503 |
| 2007/0210348 | A1 * | 9/2007 | Song | H01L 45/144 |
| | | | | 257/246 |
| 2008/0006914 | A1 * | 1/2008 | Nagai | H01L 23/49822 |
| | | | | 257/668 |
| 2008/0272331 | A1 * | 11/2008 | Mohapatra | C09K 5/10 |
| | | | | 977/840 |
| 2008/0273313 | A1 * | 11/2008 | Wang | H01L 24/19 |
| | | | | 361/761 |
| 2009/0020188 | A1 * | 1/2009 | Ulicny | F25B 21/04 |
| | | | | 148/402 |
| 2011/0024785 | A1 * | 2/2011 | Ng | H01L 33/642 |
| | | | | 257/E33.056 |
| 2011/0203839 | A1 * | 8/2011 | Iwamoto | H05K 3/4608 |
| | | | | 174/262 |
| 2013/0180105 | A1 * | 7/2013 | Moul | H01P 11/003 |
| | | | | 29/846 |
| 2014/0160682 | A1 * | 6/2014 | Ben Jamaa | H05K 7/205 |
| | | | | 427/58 |
| 2015/0243609 | A1 * | 8/2015 | Lamorey | H01L 25/165 |
| | | | | 361/717 |
| 2015/0249044 | A1 | 9/2015 | Arora et al. | |
| 2019/0110356 | A1 * | 4/2019 | Silvano De Sousa | H05K 3/22 |
| 2020/0219790 | A1 * | 7/2020 | Uppal | H01L 23/3135 |
| 2022/0124935 | A1 * | 4/2022 | Li | H05K 3/10 |

FOREIGN PATENT DOCUMENTS

| | | | |
|---|---|---|---|
| EP | 2991458 A2 | 3/2016 | |
| WO | WO-2021252933 A2 | 12/2021 | |
| WO | WO-2021252933 A3 | 12/2021 | |

OTHER PUBLICATIONS

"International Application Serial No. PCT/US2021/037064, Written Opinion dated Sep. 17, 2021", 7 pgs.

Lu, T.J., "Thermal management of high power electronics with phase change cooling", International Journal of Heat and Mass Transfer 43, (2000), 2245-2256.

Sharar, Darin J, et al., "Additively Manufacturing Nitinol as a Solid-State Phase Change Material", Proceedings of the Intersociety Conference on Thermal and Thermomechanical Phenomena in Electronic Systems, IEEE ITHERM, (2020), 7 pgs.

Sharar, Darin J, et al., "Solid-State Thermal Energy Storage Using Reversible Martensitic Transformations", Appl. Phys. Lett. 114, 143902, (2019), 19 pgs.

* cited by examiner

SHAPE MEMORY THERMAL CAPACITOR AND METHODS FOR SAME

GOVERNMENT LICENSE RIGHTS

This invention was made with government support under W911NF-16-2-004 awarded by the US Army. The government has certain rights in the invention.

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to the software and data as described below and in the drawings that form a part of this document: Copyright Raytheon Company of Waltham, Mass., USA. All Rights Reserved.

TECHNICAL FIELD

This document pertains generally, but not by way of limitation, to heat management of electronic devices.

BACKGROUND

Electronic devices include electronic boards referred to as printed wiring boards (PWB), printed circuit boards (PCB) or the like. Dielectric (insulating) layers are stacked with intervening layers of conductive traces that are electrically interconnected with devices coupled with a printed wiring board. In some examples, interconnecting conductive vias extend through dielectric layers to communicate between conductive traces and devices through one or more layers of the printed wiring board. Devices coupled with the printed wiring board include electronic components such as semiconductors, processors, memory, amplifiers, radio frequency (RF) components, microwave components, power switching devices or the like. The devices are mechanically coupled with the printed wiring board and electrically (and mechanically) coupled with conductive traces and conductive vias.

Devices coupled with the printed wiring board generate heat that is dissipated from the device and conducted through the printed wiring board to other devices. Devices operate more reliably and at higher efficiencies when cool, and accordingly performance degrades with heat. Printed wiring boards including dielectrics (insulators) are generally poor at conducting heat, and heat generated at the devices is retained by the devices.

In some examples, heat transfer is facilitated from the devices with fans that extract warm surrounding air from around the devices and the printed wiring board while drawing in cooler (ambient) air. In other examples, material such as thermal interface material (TIM) couples the device with heat transfer enhancing features, such as arrays of fins, posts, or the like that increase the surface area of the device and enhance heat transfer from the device.

In other examples, copper metal tabs or 'coins' are embedded in the printed wiring board. The copper coins absorb heat from the devices comparatively better than the PWB itself. For instance, copper has a specific heat of 0.385 J/g degree C., and accordingly absorbs 0.385 Joules per gram of the copper coin per degree Celsius of temperature change. When conductively heated by a device on the printed wiring board, the copper coin absorbs this heat and dissipates it to the surrounding PWB material over time.

OVERVIEW

The present inventors have recognized, among other things, that a problem to be solved includes maximizing heat dissipation capability from electronic devices, including electronic devices that generate significant heat (experience increased heat dissipation rates) for short periods of time (e.g., transient modes of operation). These electronic devices, such as high power RF components, amplifiers or the like, generate significant heat. These heated components operate with less efficiency, and in some examples fail.

Previous heat absorbing and transporting features fail to sufficiently absorb heat from devices. For instance, in an example including a device having a maximum operating temperature of 150 degrees C. a metal coin (such as copper) having a specific heat of 0.385 J/g degree C. has a corresponding sensible heat absorption (relative to room temperature, 21 degrees C.) of 49.67 J/g. The sensible heat absorption is a measure of the heat absorption capacity or heat capacitance of the metal coin. The metal coin is embedded within the printed wiring board and is over-plated with a common material to the conductive traces and the coin (e.g., copper). When absorbing heat from a device, such as an amplifier or other RF component operating in a transient operating mode lasting 13-30 seconds or more, sufficient heat is generated within 6 seconds or less (as shown herein) to saturate the heat capacitance of the metal coin. Because the metal coin will absorb minimal heat thereafter the temperature of the device then quickly rises above the 150 degree C. maximum operating temperature and operation of the device degrades. As also shown herein, the device temperature rises to near 185 degrees C. within 10 seconds, a temperature sufficient to frustrate efficient operation of the device and potentially cause a failure event.

The present subject matter provides a solution to this problem with a shape memory thermal capacitor that provides a solid to solid (S-S, including single or multiple) phase transition (or transitions) that enhances heat absorption by taking advantage of latent heat storage in addition to sensible heat absorption, and provides a corresponding virtual specific heat capacity superior to a metal coin (such as a copper coin described above). As described herein, the shape memory thermal capacitor provides enhanced heat absorption, and accordingly facilitates longer operation of an associated electronic device at decreased temperatures.

The shape memory thermal capacitor includes a shape memory core, for instance including a nickel alloy (e.g., nickel titanium alloy, such as Nitinol, ternary shape memory alloys such as NiTiCu or the like). The solid to solid phase changes (e.g., martensite to austenite) absorb heat in addition to the sensible heat absorption that occurs above and below the phase transition temperature (or temperatures in the case of a ternary alloy).

In some examples, a shape memory thermal capacitor described herein provides an effective capacitance around an order of magnitude or larger than that of a metal coin, such as a copper coin. For instance, one example shape memory thermal capacitor described herein provides a latent heat of 28.56 J/g degree C. over a small temperature range (5-10° C.). In comparison, for the 0.385 J/g degree C. for the copper coin example, the temperature would need to be increased 74.2° C. to achieve the same thermal energy storage density (28.56 J/g). Accordingly, the shape memory thermal capacitor provides significant enhanced thermal absorption capability in comparison to other embedded coins, such as the copper coin. Devices that benefit from a proximate embedded shape memory thermal capacitor are thereby able to operate at transient operating modes including temperatures approaching maximum specified operating temperatures without exceeding this temperature for the full term of the transient operation, such as 13-30 seconds. In other examples, devices operate at or below maximum specified operating temperatures for a significant portion of the transient operation while exceeding the temperatures for a lesser portion of the transient operation in comparison to previous metal coins, such as copper coins.

In some examples, the shape memory core of the thermal capacitor is not readily installed within a printed wiring board. For example, printed wiring boards include conductive traces, vias or the like often including a matching conductive material, such as copper. Copper coins readily bond with the matching conductive material. However, as described herein copper coins fail to provide adequate thermal capacitance for many devices, especially devices having relatively high operating temperatures during transient operation.

The shape memory thermal capacitor includes an interface jacket that bonds with both the shape memory core and the conductive components of the printed wiring board. The interface jacket includes a matching conductive material to the conductive material of the printed wiring board, such as copper. Additionally, the interface jacket isolates the shape memory core from the printed wiring board and thereby facilitates processing of the printed wiring board.

In another example, the interface jacket mitigates processing complications for shape memory materials. For instance, titanium oxides that develop along shape memory materials frustrate the bonding of the materials with other components including copper. The interface jacket includes a seed layer, such as nickel plating using an electro-less process that readily bonds with the shape memory material. This plated nickel serves as a seed layer to facilitate over plating with a variety of other metals. A bond layer envelopes the seed layer and the shape memory core. The bond layer includes a conductive material that matches the conductive material of the printed wiring board (e.g., is identical, includes one or more matching components that bond with each other, or is sufficiently similar to facilitate bonding) and accordingly readily bonds with the conductive material of the board.

Optionally, one or more layers are interposed between the shape memory core and the bond layer. One example of another layer is a ductile interface layer interposed between the seed layer and the bond layer. In this example, the ductile interface layer provides a protective layer to the shape memory core and the seed layer that maintains isolation of these components. For instance, electroless plated nickel used in the seed layer is brittle and subject to cracking. The ductile interface layer encapsulates the shape memory core and the seed layer with a protective layer that minimizes cracking and even with cracking of the seed layer maintains a strong interface between the shape memory core and the surrounding bond layer. The ductile interface layer includes, but is not limited to, an electrolytic plated material, such as electrolytically plated nickel.

With the interface jacket the shape memory thermal capacitor is installed in present printed circuit boards including conductors, such as copper, while readily bonding with the conductive components of the boards. Additionally, the shape memory thermal capacitor provides enhanced thermal capacitance in comparison to other embedded heat transfer features, such as previous metal coins.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
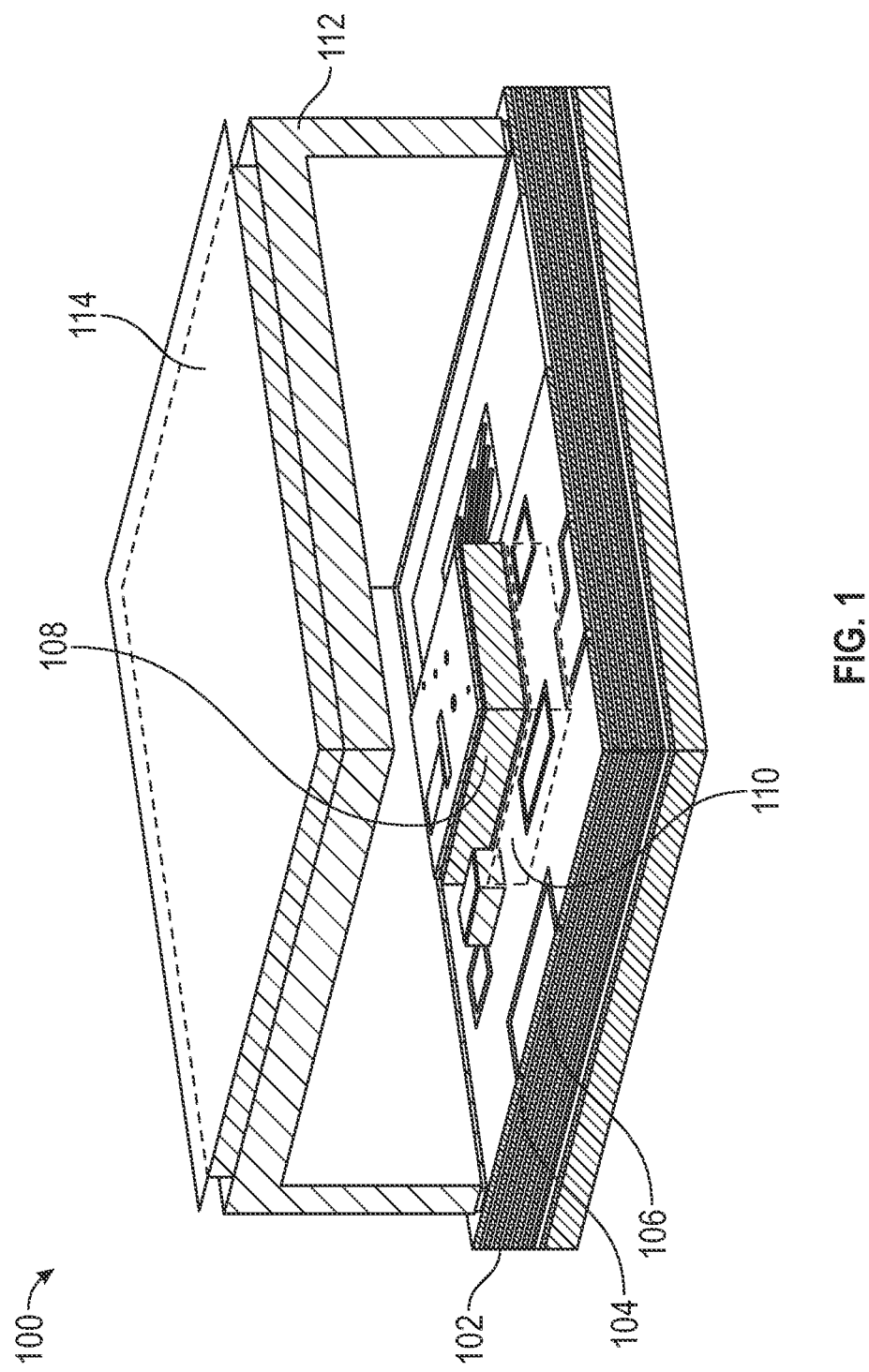
FIG. 1 is a perspective view of an electronic assembly including an example shape memory thermal capacitor.

FIG. 1 is a perspective view of one example of an electronic assembly 100 including one or more electronic devices 108 coupled with an electronic substrate 102, such as a printed wiring board (PWB), printed circuit board (PCB) or the like. The electronic substrate 102, in this example, includes one or more conductor layers 106 interposed between insulating layers 104. The insulating layers 104 include a dielectric including, but not limited to, a glass filled epoxy (e.g., FR-4), porcelain, mica, glass, polymer, metal oxides or the like. The conductor layers 106 include one or more conductive traces, pads or the like. For example, the conductor layers 106 include patterned copper traces, pads for interconnection with the devices or vias. Optionally, one or more conductive vias extend between two or more conductor layers 106 and interconnect devices, conductive traces, pads or the like, for instance with plated copper provided within a via recess.

The electronic device 108 shown in FIG. 1 includes, but is not limited to, electronic devices that, at temperatures higher than specified operating temperatures, maximum operating temperatures or the like may experience degraded performance or failure. In other examples, the electronic device 108 includes devices that that may experience enhanced operation for time periods (e.g., transient modes of operation lasting 13-30 seconds or more) with corresponding significant heat generation. At temperatures above specified or maximum operating temperatures these devices may experience degraded performance or failure when instead enhanced performance is specified for the transient time period. The electronic device 108 includes, but is not limited to, high power RF components (e.g., Gallium-Arsenide microwave integrated devices), power switching devices, semiconductors, amplifiers, processors, memory, motherboards or the like.

Referring again to FIG. 1, the electronic device 108 coupled with the electronic substrate 102 generates heat. In some examples, a heat diverting cover 112 encloses the device 108 and optionally a portion of the electronic substrate 102. Heat generated with the device 108 is conducted through the electronic substrate 102 to the portion of the heat diverting cover 112 coupled with the substrate, and through the cover 112 to a heat transfer element, such as a cold plate 114 or other element including fins, fans, coolant arrays or the like.

The insulating layers 104 are, in most examples, poor heat conductors. Accordingly, heat generated with the device 108 accumulates proximate to the device 108 and readily facilitates operation at elevated temperatures that degrade performance or cause failure. In some examples, a metal tab, such as a copper 'coin' is embedded with the electronic substrate 102 proximate to the electronic device 108 to absorb heat from the device 108, store the diverted heat, and dissipate the heat gradually through the electronic substrate 102. The metal tab diverts heat from the electronic device 108 and facilitates operation of the electronic device at lower temperatures. However, as described herein, metal tabs absorb some heat but in some examples fail to sufficiently divert, absorb and store heat in an enhanced manner that allows transient operation of the electronic device 108 in a manner that does not exceed specified or maximum operating temperatures to allow for enhanced performance when needed.

The shape memory thermal capacitor 110 shown in FIG. 1 provides enhanced heat absorption and storage to facilitate enhanced operation of the electronic device at or below specified or maximum operating temperatures for transient periods. As shown in FIG. 1, the shape memory thermal capacitor 110 is proximate to the electronic device 108. For example, the shape memory thermal capacitor 110 is embedded within the electronic substrate 102 below the electronic device 108. As described and shown herein, in other examples shape memory thermal capacitors having one or more capacitor profiles (e.g., sizes, shapes or the like) are coupled with the electronic substrate 102 at positions proximate to or remote from the electronic device (e.g., with an interconnecting thermal duct).

As described herein, the shape memory thermal capacitor 110 includes a shape memory alloy having one or more phase changes to enhance the heat absorption and storage of the capacitor. The phase changes correspond to the solid-to-solid phase changes of the shape memory alloy triggered by heating of the capacitor 110. The shape memory thermal capacitor 110 includes a shape memory core including the shape memory material, such as nickel titanium alloys (e.g., NiTi, NiTiCu) or the like. In other examples, the shape memory core includes, but is not limited to, NiTi, NiTiCu, AgCd, AuCd, CoNiAl, CoNiGa, CuAlBeX (X:Zr, B, Cr, Gd), CuAlNi, CuAlNiHf, CuSn, CuZn, CuZnX (X: Si, Al, Sn), FeMnSi, FePt, MnCu, NiFeGa, NiTiHf, NiTiPd, NiMnGa, TiNb, NiTiZr. The shape memory material includes binary and ternary shape memory materials having two or more phases, and accordingly one or more changes in phase when heated. The shape memory thermal capacitor 110 thereby provides enhanced heat absorption relative to metal tabs (e.g., copper) because of the specific heat capacity of the capacitor in combination with the latent heat of the capacitor provided with the shape memory material phase changes. In contrast, metal tabs as described herein, absorb heat based on their specific heat capacity but fail to provide additional heat absorption based on the latent heat of a shape memory material having one or more phase changes.

In operation, the shape memory thermal capacitor 110 absorbs heat generated from the associated electronic device 108 (or devices) to minimize the temperature of the device 108 and ensure operation of the electronic device 108 at or below a specified or maximum operating temperature, for instance, during transient operation (including through a portion of transient operation). The shape memory thermal capacitor 110 absorbs heat based on the specific heat capacity of the capacitor materials (e.g., shape memory core, interface jacket or the like). As the temperature of the capacitor 110 rises (with additional heat absorption) one or more phase change temperatures are reached. The shape memory core continues to absorb heat while conducting the one or more shape memory phase changes. After the phase change (or changes) is complete the shape memory core continues to absorb heat based on the specific heat capacity of the capacitor. The specific heat capacity of the capacitor and the latent heat of the shape memory core thereby enhance the heat absorption from the electronic device 108.

The heat absorbed by the shape memory thermal capacitor 110 is then gradually dissipated. For instance, heat is conducted from the capacitor 110 through the electronic substrate 102 (e.g., insulating and conductor layers 104, 106). In an example including heat transfer features, such as the heat diverting cover 112 and the cold plate 114 (or other element) the heat is dissipated through these features. The shape memory thermal capacitor 110 thereby diverts heat from the electronic device 108, absorbs the diverted heat, and facilitates the dissipation of the heat while minimizing (e.g., decreasing or eliminating) operation of the electronic device 108 at temperatures that exceed specified or maximum operating temperatures.

Figure 2A:
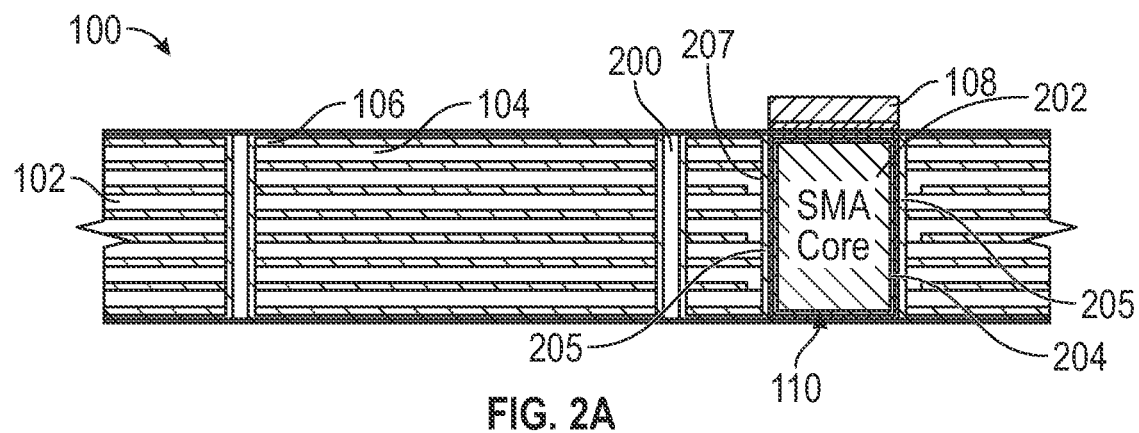
FIG. 2A is a perspective view of one example of a shape memory thermal capacitor shown in FIG. 1.

FIG. 2A is a cross sectional view of the electronic assembly 100 including the electronic device 108 coupled with the electronic substrate 102. The electronic substrate 102 is shown with insulating and conductor layers 104, 106. Conductive vias 200 are also shown in FIG. 2A extending between one or more of the conductor layers 106. The conductive vias 200 interconnect devices, conductive traces, contact pads or the like.

The shape memory thermal capacitor 110 is provided in a capacitor recess 207 of the electronic substrate 102. The substrate layers surrounding the capacitor recess 207 have a complementary profile to the shape memory thermal capacitor (e.g., a rectangle, square, irregular shape or the like). An interface is provided between the shape memory thermal capacitor 110 and the electronic substrate to enhance coupling therebetween and facilitate conductive heat transfer between the capacitor 110 and the substrate 102 (e.g., for heat dissipation). In one example, the interface includes, but is not limited to, a conductive material such as copper that readily conducts heat (and electricity) from the shape memory thermal capacitor 110 to the electronic substrate 102. The interface is optionally a capacitor plating 205 that matches the material of the conductor layers 106. For instance, with a copper conductor layer 106 the capacitor plating 205 includes, but is not limited to, copper, copper alloys, resins or other materials that are identical to the conductor layer 106 material, include one or more matching components, or are sufficiently similar to facilitate bonding therebetween. In another example, the capacitor plating 206 includes a material that matches a bond layer 208 (shown in FIG. 2B) of an interface jacket 204 (shown in Figure FIGS. 2A, 2B). For instance, the capacitor plating 206 matches the bond layer 208 of the interface jacket 204 (e.g., is identical, includes one or more matching components or are sufficiently similar to facilitate bonding). In still other examples, the capacitor plating 206 includes a resin, such as a polymer, that couples the shape memory thermal capacitor 110 with the surrounding electronic substrate 102 and facilitates heat transfer from the capacitor 110 to the substrate 102.

As further shown in FIG. 2A, the shape memory core 202 is encapsulated with the interface jacket 204. In some examples, the shape memory material of the core 202 may not readily bond with the electronic substrate or with an interface, such as the capacitor plating 205. In other examples, one or more of the electronic substrate 102 or the shape memory material are difficult to process without negatively affecting the other of the shape memory material or the substrate 102. For instance, difficult to remove oxides may develop on the shape memory material during processing of the electronic substrate 102. These oxides interfere with one or more of heat transfer or bonding of between components.

The interface jacket 204 extends around the shape memory core 202 (e.g., continuously or partially) and isolates the shape memory core 202, for instance during processing of the electronic substrate 202 including plating of the shape memory thermal capacitor 110 within the capacitor recess 207. Further, in operation the interface jacket 204 delivers heat from the electronic device 108 to the shape memory core 202 for absorption and to trigger phase changes in the shape memory material. The interface jacket 204 delivers heat from the capacitor 110 (including the core 202) to the electronic substrate 102 for dissipation of heat over time. Additionally, the interface jacket 204 provides an interface between the shape memory core 202 and other components of the electronic substrate proximate to the capacitor 110 to facilitate bonding therebetween.

Figure 2B:
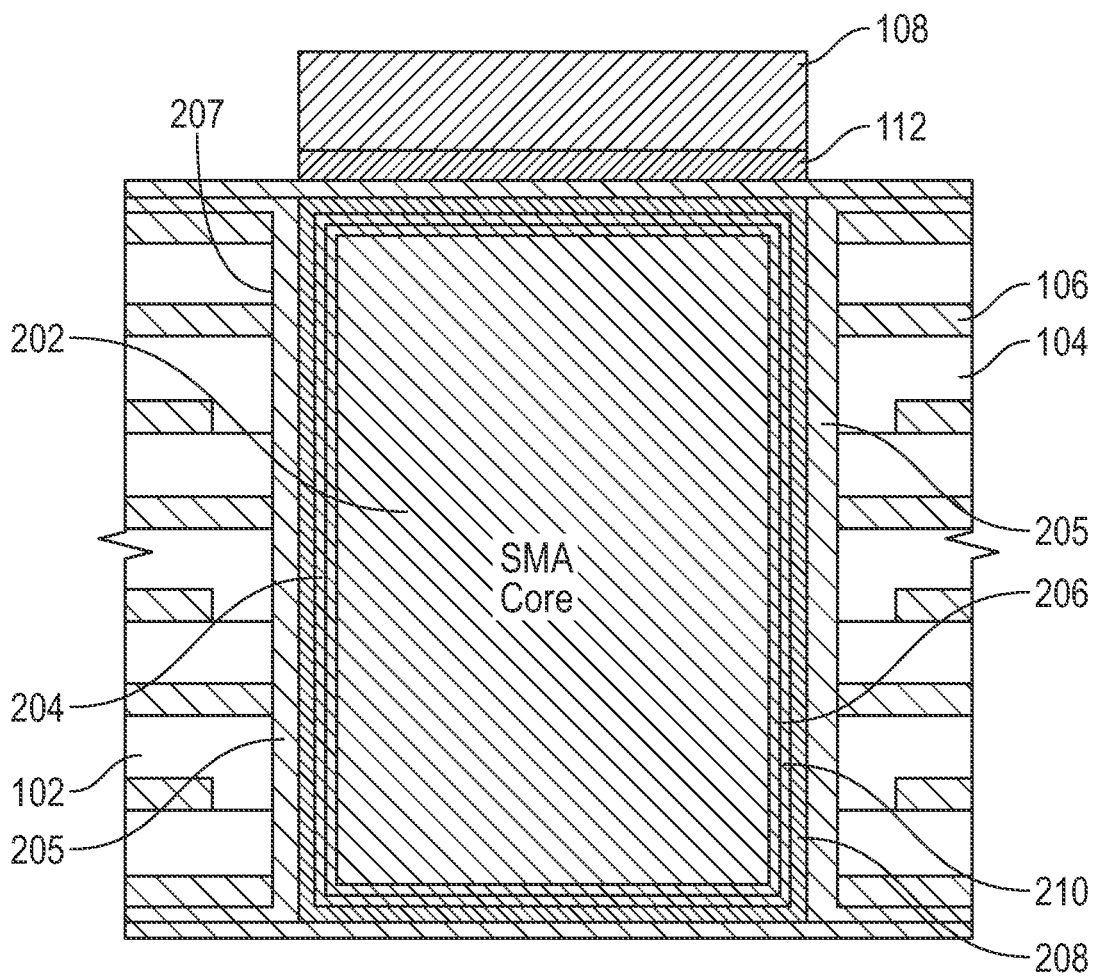
FIG. 2B is a cross sectional view of the shape memory thermal capacitor of FIG. 2A.

One example of the interface jacket 204 is shown in detail in FIG. 2B. In this example, the interface jacket 204 includes two or more components layers. For instance, the interface jacket 204 includes a seed layer 206 coupled with the shape memory core 202 and a bond layer 208 proximate the electronic substrate 102. Another layer, a ductile interface layer 210 is optionally interposed between the bond layer 208 and the seed layer 206.

Referring again to FIG. 2B, the seed layer 206 is coupled along the shape memory core 202 and provides an initial layer of the interface jacket 204. The seed layer 206 readily bonds with the shape memory core 202 while the core 202 itself may not readily bond with a conductor material of the electronic substrate 102, such as copper. In one example, the seed layer 206 is a material that readily bonds with the shape memory core 202 including, but not limited to, nickel, gold, platinum or palladium. Optionally, the seed layer 206 is applied to the shape memory core 202 with an electro-less process, such as electro-less plating.

As previously described, the shape memory core 202 when exposed may develop oxides (e.g., titanium oxide) that is difficult to remove, and interferes with bonding of the core or further processing of the capacitor 110. The seed layer 206 encloses the shape memory core 202 to isolate the core and minimizes development of these oxides (e.g., decreases or eliminates). Additionally, the seed layer 206 acts as an interface (an adhesion layer) to facilitate bonding with other materials such as layers of the interface jacket 204, capacitor plating 205 or the like. Further, if oxides develop along the seed layer 206 these oxides are generally readily removed in comparison with oxides that otherwise may develop along the shape memory core 202.

As further shown in FIG. 2B, in this example the interface jacket 204 includes the ductile interface layer 210. In one example, the seed layer 206 includes materials that are brittle and may crack or fracture during processing of the electronic substrate 102 or capacitor 110 (or phase changes of the capacitor) and interfere with bonding and heat transfer between the shape memory core 202 and other components. The ductile interface layer 210 is softer (more ductile and accordingly less brittle) than the seed layer 206 and more resistant to fracture or cracking caused with processing or operation. Additionally, the ductile interface layer 210 maintains bonding between the seed layer 206 and the shape memory core 202 even where the seed layer 206 cracks or fractures during operation or processing. The ductile interface layer 210 provides a compliant enclosure around the seed layer 206 that maintains the bond between the seed layer 206 and the shape memory core 202.

Additionally, in another example the ductile interface layer 210 minimizes diffusion between underlying and overlying components of the shape memory thermal capacitor (e.g., the core 202, seed layer 206, and bond layer 208, respectively) that may interfere with maintenance of robust bonding, heat transfer or the like. Accordingly, the ductile interface layer 210 is optionally referred to as a diffusion isolation layer (while including or not including the ductility described herein).

The ductile interface layer 210 optionally includes materials similar to the seed layer 206, such as nickel, gold, platinum, palladium or the like. In one example, the ductile interface layer 210 is applied in a different manner than the seed layer 206, for instance with an electrolytic process, such as electrolytic plating.

The interface jacket 204 includes the bond layer 208 along an exterior portion of the shape memory thermal capacitor 110. The bond layer 208 facilitates bonding between the capacitor 110 and the electronic substrate 102. For instance, the bond layer couples with one or more of the seed layer 206, ductile interface layer 210 or the like. In one example, the bond layer 208 includes a matching conductive material that matches one or more component materials of the electronic substrate 102, such as the conductor layers 106. For instance, the bond layer includes a conductive matching material that is identical, includes one or more matching components that bond with the conductor layers, or is sufficiently similar to facilitate bonding with the substrate 102. The bond layer 208 includes copper that extends along one or more of the shape memory core 202 or the intervening layers (e.g., the seed layer 206, ductile interface layer 210) or the like. In the example electronic assembly 100 the conductor layers 106 and capacitor plating 205 include copper and the bond layer 208 includes copper (e.g., copper plating). The matching conductive materials facilitate bonding between the layer 208 and the components of the electronic substrate 102.

The interface jacket 204 accordingly facilitates the coupling between the shape memory thermal capacitor 110 and the electronic substrate 102. Additionally, the interface jacket 204, as described herein, isolates the shape memory core 202 and the electronic substrate 102 from each other while allowing both processing of the electronic substrate 102 with the capacitor 110 present and operation of the shape memory core 202 to provide enhanced heat absorption.

Figure 3:
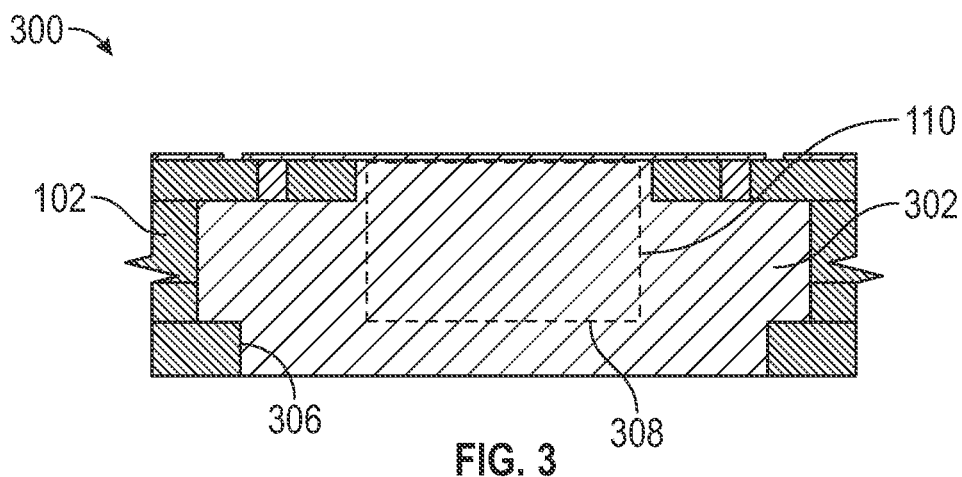
FIG. 3 is a cross sectional view of an example unitary coin with a superimposed example of a shape memory thermal capacitor.

FIG. 3 is a cross sectional view of an example electronic assembly 300 including the shape memory thermal capacitor 110 (broken lines) superimposed over a metal (e.g., copper) tab 302. In this illustration both of the metal tab 302 and the smaller profile shape memory thermal capacitor 110 provide similar performance with regard to heat absorption and dissipation. For instance, the shape memory thermal capacitor 110 has a shape memory capacitor profile 308 while the metal tab 302 has the larger tab profile 306 (exaggerated for illustration). The shape memory core 202 (see FIGS. 2A, B) provides a higher virtual specific heat capacity because of the latent heat of the shape memory material phase change (or changes) in comparison to the metal tab 302 that relies on the specific heat of the tab 302 (e.g., copper or the like). Accordingly, the profile 306 of the shape memory thermal capacitor 110 is smaller while providing similar performance to the metal tab 302. The smaller profile 306 of the shape memory thermal capacitor 110 assumes a correspondingly smaller portion of the electronic substrate 102 than the metal tab 302. The available electronic substrate 102 is thereby freed for additional devices, conductor layers 106 (traces or pads) or vias that are otherwise unavailable with the metal tab 302.

In another example, the shape memory thermal capacitor 110 is optionally enlarged, for instance to correspond with the metal tab profile 306 or is between the profiles 306 and 308, to provide enhanced performance relative to the metal tab 302. As previously described, the shape memory thermal capacitor 110 shown in FIG. 3 provides similar performance to the metal tab 302. Accordingly, by enlarging the shape memory thermal capacitor 110 enhanced heat absorption (e.g., virtual specific heat) is realized in comparison to the metal tab 302. The enhancement to performance of the shape memory thermal capacitor 110 relative to the metal tab 302 is achieved without enlarging the capacitor 110 to a profile corresponding with the tab profile 306. Accordingly, enhanced performance is provided with the shape memory thermal capacitor 110 while at the same time freeing portions of the electronic substrate 102 for additional conductive components, devices or the like (relative to the tab profile 306 of the metal tab 302).

Figure 4:
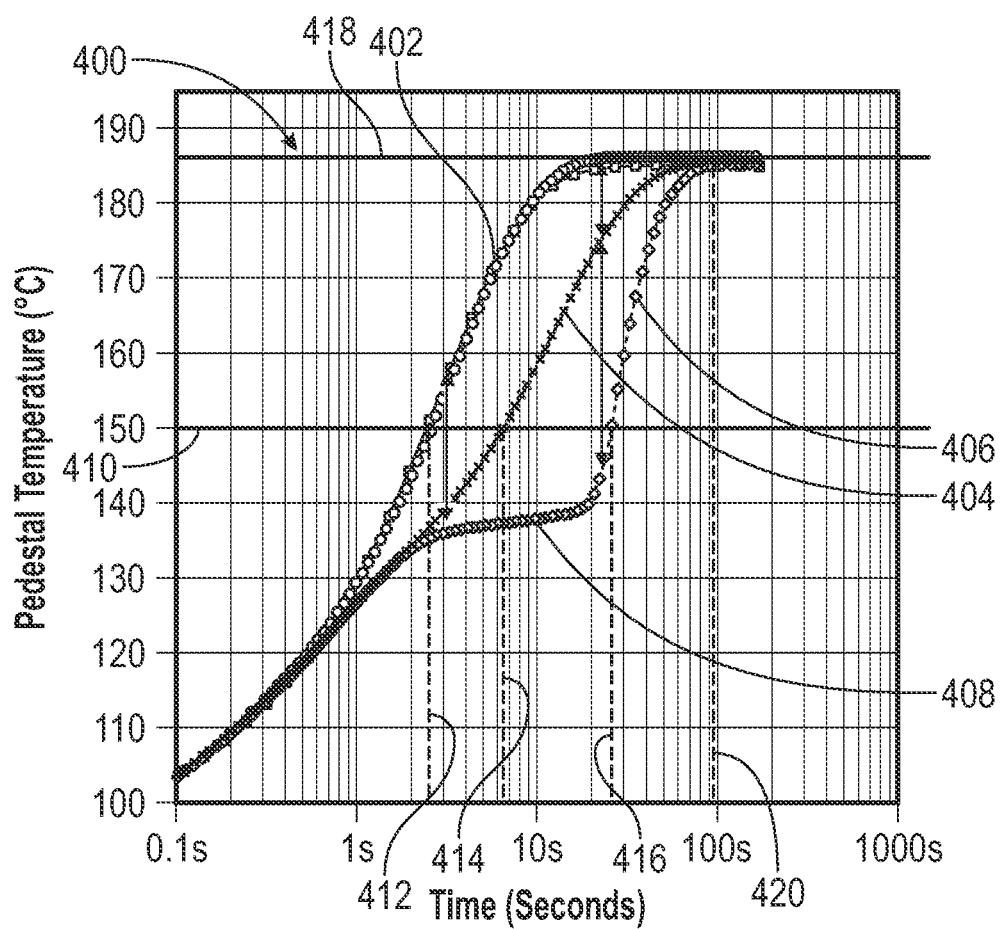
FIG. 4 is a temperature and time plot for an example electronic assembly including the shape memory thermal capacitor of FIGS. 2A and 2B.

FIG. 4 is an example temperature and time plot 400 showing the temperature of a device 108 (or an associated pedestal associated with the device 108). Temperature in degrees Celsius is provided along the y-axis while time is provided along the x-axis (in a logarithmic scale). The plot 400 includes plotted temperatures responses relative to time for three device scenarios including transient operation of the device 108 where the device includes a specified or maximum operating temperature 410 of 150 degrees C. In one example, the specified operating temperature 410 corresponds to an operating temperature of the device 108 without appreciable performance degradation or failure, while operating above the temperature corresponds to potential degradation or failure of the device 108.

The first temperature response 402 corresponds to an electronic device 108 without an associated heat absorption component, such as a metal tab or the shape memory thermal capacitor 110. Instead, the device 108 is coupled with an electronic substrate, such as the substrate 204 shown in FIG. 2A without these features. As shown in FIG. 4 the temperature response 402 steadily rises with transient operation and crosses the specified operating temperature 410 at the intersection 412 corresponding to approximately 2.5 seconds. The temperature of the device 108 continues to rise to a maximum temperature of 185 degrees C. as shown (e.g., at approximately 25 seconds).

The second temperature response 404 corresponds to the electronic device 108 with a metal tab as described herein, for instance a copper metal tab embedded within the electronic substrate 102. As shown the second temperature response 404 has a delayed response relative to the first temperature response 402 corresponding to absorption of heat from the electronic device 108 by the metal tab. In this example, the intersection 414 of the second temperature response 404 occurs at approximately 6.5 seconds (4 seconds later than the first response 402). Accordingly, in this example the electronic device 108 conducts the transient operation at or below the specified or maximum operating temperature 410 (150 degrees C.) for a longer period than the electronic device without the metal tab having the temperature response 402. In the second temperature response 404 the temperature of the electronic device continues to rise after the intersection 414 to the maximum temperature 418 (185 degrees C.) at approximately 100 seconds, similar to the first temperature response. Accordingly, the metal tab provides four seconds of additional transient operation of the electronic device 108 in comparison to the device 108 (and associated response 402) without the metal tab.

The third temperature response 406 corresponds to the electronic device 108 with one of the example shape memory thermal capacitors (e.g., capacitor 110) described herein embedded within the electronic substrate 102. As shown the third temperature response 404 has a delayed response relative to each of the first and second temperature responses 402, 404 that maintains operation of the electronic device at or below the specified or maximum operating temperature (e.g., 150 degrees C.) for a significantly longer period. For instance, the third temperature response 404 has an intersection 416 with the specified or maximum operating temperature at approximately 25 seconds, 18.5 seconds longer than the second temperature response 404 (with the metal tab) and an order of magnitude greater.

As shown in FIG. 4, the third temperature response 406 includes a planar segment 408 absent from the other responses 402, 404. The planar segment 408 corresponds with the latent heat associated with the one or more phase changes of the shape memory core 202 of the capacitor 110. As shown, the planar segment 408 (and the corresponding phase change) prolongs the operation of the electronic device 108 at or below the specified or maximum operating temperature 410 and accordingly facilitates the later intersection 416 (at 25 seconds) of the third temperature response 406 in comparison to the earlier intersection 414 (at 6.5 seconds) for the second temperature response 404. In one example, the shape memory core 202 delays or pushes out the intersection of the third temperature response 406 relative to the second temperature response and facilitates enhanced operation of the electronic device 108 for a longer period than otherwise available with the second temperature response 404 with the metal tab and the first temperature response 402.

After the shape memory thermal capacitor 110 changes phase the temperature of the device 108 rises toward the 185 degrees C. maximum temperature 418, reaching the temperature at approximately 100 seconds (corresponding to 420 in FIG. 4). The electronic device 108 with the shape memory thermal capacitor 110 in this example does experience operation at temperatures above the specified or maximum operating temperature 410 of 150 degrees C. However, the length of time operating above the temperature 410 begins at approximately 25 seconds while the device 108 with the metal tab begins at approximately 6.5 seconds. In some examples transient operation for electronic devices 108 may last 13 to 30 seconds. Accordingly, the shape memory thermal capacitor 110 facilitates significant periods of transient operation of 30 seconds or less while at or below the specified or maximum operating temperature 410 while the metal tab conversely limits operation of the electronic device below the temperature 410 to periods of time less than even the 13 second floor of example transient operation.

Figure 5A:
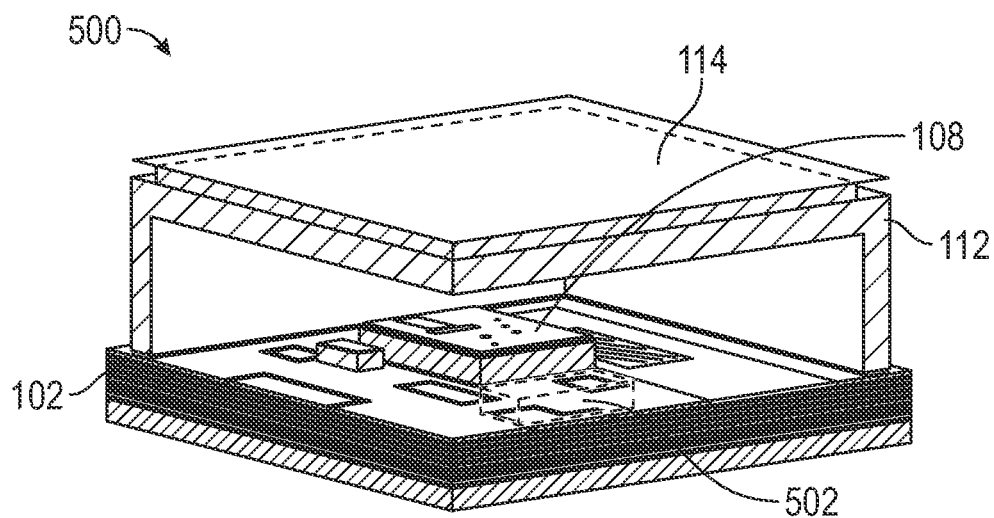
FIG. 5A is a perspective view of an electronic assembly including another example shape memory thermal capacitor proximate to a device and within an electronic substrate.
Figure 5B:
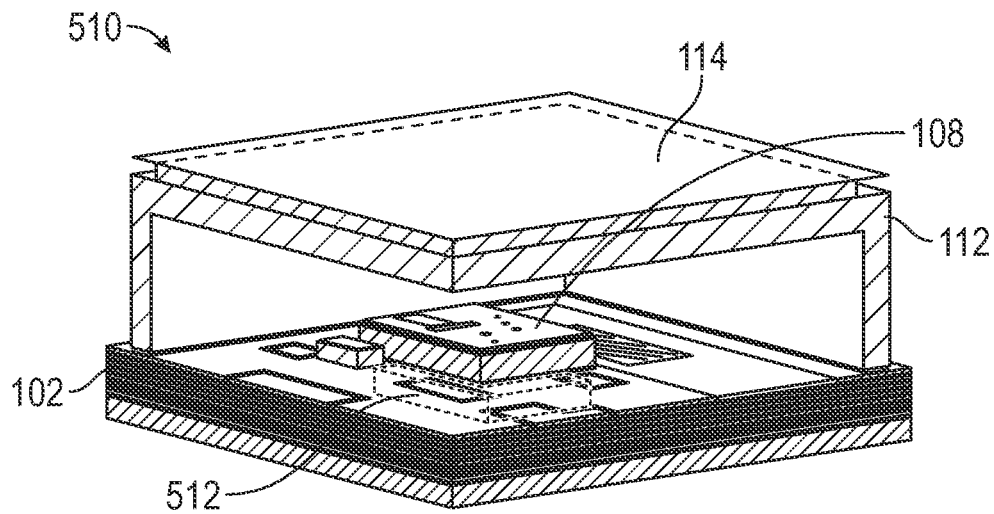
FIG. 5B is a perspective view of an electronic assembly including an additional example of a shape memory thermal capacitor having an irregular shape.
Figure 5C:
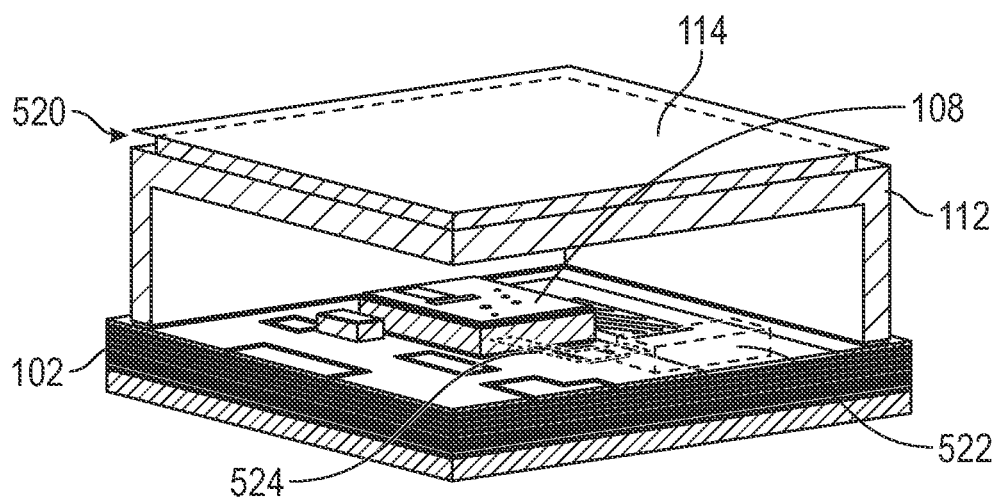
FIG. 5C is a perspective view of an electronic assembly including a supplemental example of a shape memory thermal capacitor interconnected with a device.

FIGS. 5A-C includes example electronic assemblies 500, 510, 520 having respective shape memory thermal capacitors 502, 512, 522. FIGS. 1, 5A-C show example shape memory thermal capacitors with varied profiles and locations relative to the electronic device 108. As shown in FIG. 1, the shape memory thermal capacitor 110 is proximate to the electronic device 108. For instance, the capacitor 110 is embedded within the electronic substrate 102 beneath the electronic device 108. In the example shown in FIG. 1, the shape memory thermal capacitor 110 includes a similar profile (e.g., one or more of size, shape, volume or the like) relative to the electronic device 108. For example, the capacitor 110 includes an upper surface area similar to the proximate lower surface area of the electronic device 108 to facilitate heat transfer to the capacitor 110 from the device 108 while minimizing direct heat transfer from the device to the electronic substrate 102.

Referring now to FIG. 5A, another electronic assembly 500 is shown having a shape memory thermal capacitor 502 proximate to the electronic device 108 and embedded within the electronic substrate 102. In this example, the capacitor 502 has a smaller profile relative to the electronic device 108. As previously described, the shape memory thermal capacitor 110 (or 502 in this example) provides enhanced heat absorption and heat storage relative to a metal tab (e.g., tab 302 as shown in FIG. 3). Accordingly, the smaller profile shape memory thermal capacitor 502 provides similar or better heat absorption and storage in comparison to a larger metal tab. The smaller profile of the capacitor 502 provides additional access to the electronic device 108. For instance, additional conductive traces, contact pads or the like are readily routed through the electronic substrate 102 to the device 108 in space otherwise assumed by a larger profile metal tab 302. In some examples, the electronic device 108 includes different architectures that leverage the electronic substrate 102 made available with the smaller profile shape memory thermal capacitor 502.

Additionally, as shown in FIG. 5A the shape memory thermal capacitor 502 is optionally positioned proximate to the electronic device 108, for instance to beneath the device, to the side of the device, or therebetween. The enhanced performance of the shape memory thermal capacitors (502 in this example) facilitates proximate positioning of the capacitors without requiring installation of the capacitors immediately beneath the devices 108, though the capacitors are readily positioned beneath the devices 108 as shown in FIG. 1.

FIG. 5B is another example of an electronic assembly 510 including the shape memory thermal capacitor 512. As shown the shape memory thermal capacitor 512 has an irregular profile including, but not limited to, an L-profile (shown in FIG. 5B), ovular profile, linear profile or the like. The capacitor 512 is proximate to the electronic device 108 to absorb and store heat. The irregular profile of the capacitor 512 facilitates the use of an electronic device 108 having an irregular profile, irregular arrangement of contact pads or the like. In other examples, the irregular profile of the shape memory thermal capacitor 512 facilitates the installation of devices, conductive traces, vias or the like in the space underlying the device 108 while still providing the heat absorption and storage of the capacitor 512 in proximity to the device 108.

FIG. 5C shows another electronic assembly 520 including the shape memory thermal capacitor 522 installed within the electronic substrate 102. In this example, the shape memory thermal capacitor 522 is spaced from the electronic device 108. In one example, a thermal duct 524 is provided with the electronic substrate 102 and interconnects the capacitor 522 with a location proximate to the electronic device 108. The thermal duct 524 includes one or more materials configured to promote heat transfer from the electronic device 108 to the shape memory thermal capacitor 522. For instance, the thermal duct 524 includes, but is not limited to, metals, shape memory materials, heat conducting polymers or resins or the like that preferentially transfer heat (relative to the electronic substrate 102) from the electronic device 108 to the shape memory thermal capacitor 522.

In operation, the electronic device 108 generates heat and the thermal duct 524 directs the generated heat away from the device 108 and proximate electronic substrate toward the shape memory thermal capacitor 522. As shown in FIG. 5C, the shape memory thermal capacitor 522 is spaced from the electronic device 108. The thermal duct 524 delivers heat from the device 108 to the remote capacitor 522 for absorption and storage (and eventually for dissipation). In one example, the capacitor 522 is positioned proximate to one or more other heat transfer components, such as the heat diverting cover 112 shown in FIG. 5C (and FIG. 1), arrays of fins, posts, fans or the like. The capacitor 522 accordingly localizes the absorbed and stored heat and facilitates its dissipation with an associated (e.g., proximate) heat transfer component. Additionally, the spacing of the shape memory thermal capacitor 522 from the electronic device 108 frees space otherwise devoted to a metal tab. Instead, devices, conductive traces, vias, contact pads or the like are readily included in the electronic substrate proximate to the electronic device 108 while at the same time providing the enhanced heat absorption and storage with the shape memory thermal capacitor 522.

Figure 6:
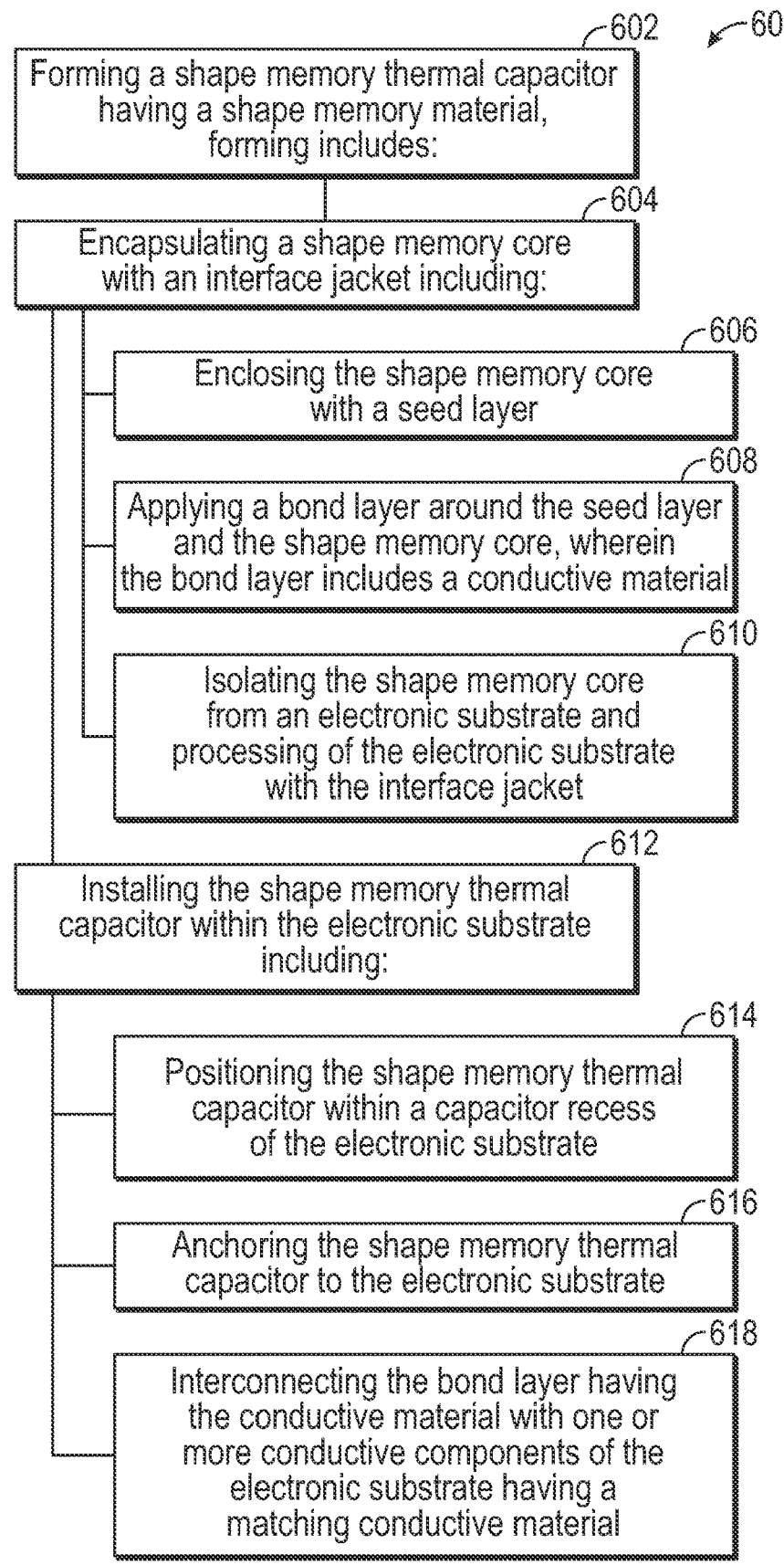
FIG. 6 is a block diagram showing one example of a method for making an electronic assembly.

FIG. 6 shows one example of a method 600 for making an electronic assembly, such as the assembly 100 described herein. In describing the method 600 reference is made to one or more components, features, functions, steps or the like described herein. Where convenient reference is made to the components, features, functions, steps or the like with reference numerals. Reference numerals provided are exemplary and are not exclusive. For instance, the features, components, functions, steps and the like described in the method 600 include, but are not limited to, the corresponding numbered elements, other corresponding features described herein, both numbered and unnumbered as well as their equivalents.

The method 600 includes forming a shape memory thermal capacitor 110 having a shape memory material at 602. Forming includes at 604 encapsulating a shape memory core 202 with an interface jacket 204. In one example, escapsulating the core 202 includes at 606 enclosing the shape memory core 202 with a seed layer 206, such as nickel (e.g., electro-less applied nickel). Encapsulating includes at 608 applying a bond layer 208 around the seed layer 206 and the shape memory core 202. The bond layer 208 includes a conductive material, such as copper. At 610 encapsulating includes isolating the shape memory core 202 from an electronic substrate 102 and processing of the electronic substrate with the interface jacket 204.

The method 600 includes at 612 installing the shape memory thermal capacitor 110 within the electronic substrate 102. Installing includes positioning the shape memory thermal capacitor within a capacitor recess 207 of the electronic substrate 102, at 614. At 616 the shape memory thermal capacitor 110 is anchored to the electronic substrate 102, for instance with a conductive material, resin or the like (e.g., copper, plating, adhesives, polymers, including but not limited to heat or electrically conductive adhesives or polymers or the like). Optionally, the conductive material for anchoring, such as plating, includes the conductive material of the bond layer or conductor layers 106 as a constituent component. At 618, the method 600 includes interconnecting the bond layer 208 having the conductive material with one or more conductive components of the electronic substrate 102 having a matching conductive material. As described herein, matching materials include materials that are identical, include one or more matching components that bond with each other, or materials sufficiently similar to facilitate bonding.

Several examples for the method 600 follow. In one example, encapsulating the shape memory core includes applying an interface ductile layer 210 over the seed layer 206. In this example, applying the bond layer 208 includes applying the bond layer 208 over the interface ductile layer 210. In another example, enclosing the shape memory core 202 with the seed layer 206 includes electroless plating the seed layer 206 to the shape memory core 202. The interface ductile layer 210 (where included) is optionally applied with electrolytic plating over the seed layer 206.

In another example, interconnecting the bond layer 208 having the conductive material with the one or more conductive components (e.g., conductor layers 106 having traces, contact pads, vias or the like) of the electronic substrate 102 having the matching conductive material includes the conductive material of the substrate 102 and the matching conductive material of the bond layer 208 are identical.

VARIOUS NOTES AND ASPECTS

Aspect 1 can include subject matter such as an electronic assembly including a thermal capacitor comprising: an electronic substrate including: one or more insulating layers; and one or more conductor layers provided along the one or more insulating layers, the one or more conductor layers including a conductive material; and a shape memory thermal capacitor received in the electronic substrate, the shape memory thermal capacitor includes: a shape memory core including a shape memory material.

Aspect 2 can include, or can optionally be combined with the subject matter of Aspect 1, to optionally include wherein the shape memory material includes a solid-to-solid phase change material having a corresponding phase change latent heat absorption.

Aspect 3 can include, or can optionally be combined with the subject matter of one or any combination of Aspects 1 or 2 to optionally include wherein the shape memory material includes a Nickel Titanium alloy.

Aspect 4 can include, or can optionally be combined with the subject matter of one or any combination of Aspects 1-3 to optionally include wherein the shape memory thermal capacitor includes an interface jacket coupled along the shape memory core, the interface jacket isolates the shape memory core from the one or more conductor layers, and the interface jacket includes a matching conductive material to the conductive material of the one or more conductor layers.

Aspect 5 can include, or can optionally be combined with the subject matter of one or any combination of Aspects 1-4 to optionally include wherein the interface jacket includes a plurality of component layers.

Aspect 6 can include, or can optionally be combined with the subject matter of Aspects 1-5 to optionally include wherein the plurality of component layers include: a seed layer directly coupled with the shape memory core, wherein the seed layer encloses the shape memory core; and a bond layer enveloping the seed layer and the shape memory core, wherein the bond layer includes the conductive material, and the bond layer is coupled with the one or more conductor layers of the electronic substrate.

Aspect 7 can include, or can optionally be combined with the subject matter of Aspects 1-6 to optionally include wherein the plurality of component layers include a ductile interface layer interposed between the seed layer and the bond layer, and the ductile interface layer has a greater ductility relative to the seed layer.

Aspect 8 can include, or can optionally be combined with the subject matter of Aspects 1-7 to optionally include wherein the seed layer includes an electroless plated material and the ductile interface layer includes an electrolytic plated material.

Aspect 9 can include, or can optionally be combined with the subject matter of Aspects 1-8 to optionally include wherein the conductive material and the matching conductive material are identical.

Aspect 10 can include, or can optionally be combined with the subject matter of Aspects 1-9 to optionally include wherein the one or more conductor layers having conductive material are bonded with the interface jacket having the matching conductive material.

Aspect 11 can include, or can optionally be combined with the subject matter of Aspects 1-10 to optionally include wherein the shape memory thermal capacitor is plated into the electronic substrate with the conductive material.

Aspect 12 can include, or can optionally be combined with the subject matter of Aspects 1-11 to optionally include a heat generating electronic device coupled with the electronic substrate, and the shape memory thermal capacitor is proximate to the heat generating electronic device.

Aspect 13 can include, or can optionally be combined with the subject matter of Aspects 1-12 to optionally include a shape memory thermal capacitor for electronic devices, the shape memory thermal capacitor comprising: a shape memory core including a shape memory material with a solid-to-solid phase change material having a corresponding phase change latent heat absorption; and an interface jacket coupled along the shape memory core, the interface jacket encapsulates the shape memory core, and the interface jacket includes: a seed layer coupled with the shape memory core, wherein the seed layer encloses the shape memory core; and a bond layer coupled around the seed layer and the shape memory core, wherein the bond layer includes a conductive material.

Aspect 14 can include, or can optionally be combined with the subject matter of Aspects 1-13 to optionally include wherein one or more of the seed layer or the bond layer isolates the shape memory core from an exterior environment.

Aspect 15 can include, or can optionally be combined with the subject matter of Aspects 1-14 to optionally include wherein one or more of the seed layer or the bond layer fully encapsulates the shape memory core.

Aspect 16 can include, or can optionally be combined with the subject matter of Aspects 1-15 to optionally include wherein the interface jacket includes an interface ductile layer interposed between the seed layer and the bond layer, and the ductile interface layer has a greater ductility relative to the seed layer.

Aspect 17 can include, or can optionally be combined with the subject matter of Aspects 1-16 to optionally include wherein the seed layer includes an electroless plated material and the ductile interface layer includes an electrolytic plated material.

Aspect 18 can include, or can optionally be combined with the subject matter of Aspects 1-17 to optionally include wherein one or both of the seed layer or the ductile interface layer include nickel, and the bond layer includes copper.

Aspect 19 can include, or can optionally be combined with the subject matter of Aspects 1-18 to optionally include wherein the shape memory material includes a nickel titanium alloy.

Aspect 20 can include, or can optionally be combined with the subject matter of Aspects 1-19 to optionally include a method for making an electronic assembly comprising: forming a shape memory thermal capacitor having a shape memory material, forming includes: encapsulating a shape memory core with an interface jacket including: enclosing the shape memory core with a seed layer; applying a bond layer around the seed layer and the shape memory core, wherein the bond layer includes a conductive material; and isolating the shape memory core from an electronic substrate and processing of the electronic substrate with the interface jacket; and installing the shape memory thermal capacitor within the electronic substrate including: positioning the shape memory thermal capacitor within a capacitor recess of the electronic substrate; anchoring the shape memory thermal capacitor to the electronic substrate; and interconnecting the bond layer having the conductive material with one or more conductive components of the electronic substrate having a matching conductive material.

Aspect 21 can include, or can optionally be combined with the subject matter of Aspects 1-20 to optionally include wherein anchoring the shape memory thermal capacitor includes plating the shape memory thermal capacitor with conductive plating including the conductive material.

Aspect 22 can include, or can optionally be combined with the subject matter of Aspects 1-21 to optionally include wherein encapsulating the shape memory core includes applying an interface ductile layer over the seed layer; and
applying the bond layer includes applying the bond layer over the interface ductile layer.

Aspect 23 can include, or can optionally be combined with the subject matter of Aspects 1-22 to optionally include wherein enclosing the shape memory core with the seed layer includes electroless plating the seed layer to the shape memory core; and applying the interface ductile layer includes electrolytic plating the interface ductile layer over the seed layer.

Aspect 24 can include, or can optionally be combined with the subject matter of Aspects 1-23 to optionally include wherein interconnecting the bond layer having the conductive material with the one or more conductive components of the electronic substrate having the matching conductive material includes the conductive material and the matching conductive material are identical.

Each of these non-limiting aspects can stand on its own, or can be combined in various permutations or combinations with one or more of the other aspects.

The above description includes references to the accompanying drawings, which form a part of the detailed description. The drawings show, by way of illustration, specific embodiments in which the invention can be practiced. These embodiments are also referred to herein as "aspects" or "examples." Such aspects or example can include elements in addition to those shown or described. However, the present inventors also contemplate aspects or examples in which only those elements shown or described are provided. Moreover, the present inventors also contemplate aspects or examples using any combination or permutation of those elements shown or described (or one or more features thereof), either with respect to a particular aspects or examples (or one or more features thereof), or with respect to other Aspects (or one or more features thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

The above description is intended to be illustrative, and not restrictive. For example, the above-described aspects or examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as aspects, examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An electronic assembly including a thermal capacitor comprising:
an electronic substrate including:
one or more insulating layers; and
one or more conductor layers provided along the one or more insulating layers, the one or more conductor layers including a conductive material; and
a shape memory thermal capacitor received in the electronic substrate, the shape memory thermal capacitor includes:
a shape memory core including a shape memory material; and
an interface jacket coupled along the shape memory core, the interface jacket isolates the shape memory core from the one or more conductor layers, and the interface jacket includes a matching conductive material to the conductive material of the one or more conductor layers.

2. The electronic assembly of claim 1, wherein the shape memory material includes a solid-to-solid phase change material having a corresponding phase change latent heat absorption.

3. The electronic assembly of claim 1, wherein the shape memory material includes a Nickel Titanium alloy.

4. The electronic assembly of claim 1, wherein the interface jacket includes a plurality of component layers.

5. The electronic assembly of claim 4, wherein the plurality of component layers include:
a seed layer directly coupled with the shape memory core, wherein the seed layer encloses the shape memory core; and
a bond layer enveloping the seed layer and the shape memory core, wherein the bond layer includes the conductive material, and the bond layer is coupled with the one or more conductor layers of the electronic substrate.

6. The electronic assembly of claim 5, wherein the plurality of component layers include a ductile interface layer interposed between the seed layer and the bond layer, and the ductile interface layer has a greater ductility relative to the seed layer.

7. The electronic assembly of claim 6, wherein the seed layer includes an electroless plated material and the ductile interface layer includes an electrolytic plated material.

8. The electronic assembly of claim 1, wherein the conductive material and the matching conductive material are identical.

9. The electronic assembly of claim 1, wherein the one or more conductor layers having conductive material are bonded with the interface jacket having the matching conductive material.

10. The electronic assembly of claim 1, wherein the shape memory thermal capacitor is plated into the electronic substrate with the conductive material.

11. The electronic assembly of claim 1 comprising a heat generating electronic device coupled with the electronic substrate, and the shape memory thermal capacitor is proximate to the heat generating electronic device.

12. A shape memory thermal capacitor for electronic devices, the shape memory thermal capacitor comprising:
a shape memory core including a shape memory material with a solid-to-solid phase change material having a corresponding phase change latent heat absorption; and
an interface jacket coupled along the shape memory core, the interface jacket encapsulates the shape memory core, and the interface jacket includes:
a seed layer coupled with the shape memory core, wherein the seed layer encloses the shape memory core; and
a bond layer coupled around the seed layer and the shape memory core, wherein the bond layer includes a conductive material.

13. The shape memory thermal capacitor of claim 12, wherein one or more of the seed layer or the bond layer isolates the shape memory core from an exterior environment.

14. The shape memory thermal capacitor of claim 12, wherein one or more of the seed layer or the bond layer fully encapsulates the shape memory core.

15. The shape memory thermal capacitor of claim 12, wherein the interface jacket includes an interface ductile layer interposed between the seed layer and the bond layer, and the ductile interface layer has a greater ductility relative to the seed layer.

16. The shape memory thermal capacitor of claim 15, wherein the seed layer includes an electroless plated material and the ductile interface layer includes an electrolytic plated material.

17. The shape memory thermal capacitor of claim 15, wherein one or both of the seed layer or the ductile interface layer include nickel, and the bond layer includes copper.

18. The shape memory thermal capacitor of claim 12, wherein the shape memory material includes a nickel titanium alloy.

19. A method for making an electronic assembly comprising:
forming a shape memory thermal capacitor having a shape memory material, forming includes:
encapsulating a shape memory core with an interface jacket including:
enclosing the shape memory core with a seed layer;
applying a bond layer around the seed layer and the shape memory core, wherein the bond layer includes a conductive material; and
isolating the shape memory core from an electronic substrate and processing of the electronic substrate with the interface jacket; and
installing the shape memory thermal capacitor within the electronic substrate including:
positioning the shape memory thermal capacitor within a capacitor recess of the electronic substrate;
anchoring the shape memory thermal capacitor to the electronic substrate; and
interconnecting the bond layer having the conductive material with one or more conductive components of the electronic substrate having a matching conductive material.

20. The method of claim 19, wherein anchoring the shape memory thermal capacitor includes plating the shape memory thermal capacitor with conductive plating including the conductive material.

21. The method of claim 19, wherein encapsulating the shape memory core includes applying an interface ductile layer over the seed layer; and
applying the bond layer includes applying the bond layer over the interface ductile layer.

22. The method of claim 21, wherein enclosing the shape memory core with the seed layer includes electroless plating the seed layer to the shape memory core; and applying the interface ductile layer includes electrolytic plating the interface ductile layer over the seed layer.

23. The method of claim 19, wherein interconnecting the bond layer having the conductive material with the one or more conductive components of the electronic substrate having the matching conductive material includes the conductive material and the matching conductive material are identical.

\* \* \* \* \*